(12) United States Patent
    Pellegrini

(10) Patent No.: US 10,557,650 B2
(45) Date of Patent: Feb. 11, 2020

(54) APPARATUS FOR THE COOLING OF A DRINKING LIQUID, IN PARTICULAR DRINKING WATER, WITH INNOVATIVE COOLING SYSTEM WITH PELTIER EFFECT

(71) Applicant: BIOTECH TRENTINO S.P.A., Trento TN (IT)

(72) Inventor: Andrea Pellegrini, Trento TN (IT)

(73) Assignee: BIOTECH TRENTINO S.P.A., Trento TN (IT)

( * ) Notice: Subject to any disclaimer, the term of this patent is extended or adjusted under 35 U.S.C. 154(b) by 359 days.

(21) Appl. No.: 15/327,554

(22) PCT Filed: Jul. 22, 2015

(86) PCT No.: PCT/EP2015/066803
    § 371 (c)(1),
    (2) Date: Jan. 19, 2017

(87) PCT Pub. No.: WO2016/012521
    PCT Pub. Date: Jan. 28, 2016

(65) Prior Publication Data
    US 2017/0176060 A1    Jun. 22, 2017

(30) Foreign Application Priority Data
    Jul. 23, 2014 (IT) ............... MI2014A1335

(51) Int. Cl.
    *F25B 21/02*    (2006.01)
    *F25D 19/00*    (2006.01)
    *H01L 35/00*    (2006.01)
(52) U.S. Cl.
    CPC ............ *F25B 21/02* (2013.01); *F25D 19/006* (2013.01); *H01L 35/00* (2013.01); *F25B 2321/021* (2013.01); *F25B 2321/0252* (2013.01)

(58) Field of Classification Search
    CPC ............... F25B 21/02; F25B 2321/021; F25B 2321/0252; H01L 35/00; B67D 1/0014; B67D 1/0869
    See application file for complete search history.

(56) References Cited

U.S. PATENT DOCUMENTS 2,928,253 A * 3/1960 Lopp ...................... F25B 21/02
                                                  165/201
3,399,539 A   9/1968 Harvey
(Continued)

FOREIGN PATENT DOCUMENTS

DE    198 55 214 A1    6/1999
EP    0 832 290 A1     4/1998
(Continued)

OTHER PUBLICATIONS

International Search Report, dated Oct. 9, 2015, from corresponding PCT application.

*Primary Examiner* — Kun Kai Ma
(74) *Attorney, Agent, or Firm* — Young & Thompson

(57) ABSTRACT

The disclosed apparatus cools a drinking liquid utilizing the Peltier effect, and optionally includes a system of gasification for gasifying the drinking liquid, once cooled. The cooling system in turn includes: a first cooling circuit, in which an operating fluid circulates, associated with a hot side of a Peltier cell; and a second cooling circuit, in which the drinking liquid circulates, associated with a cold side of the Peltier cell. The Peltier cell is integrated in a cooling unit exhibiting a special sandwich structure which integrates, as well as the Peltier cell, a first and a second heat exchanger, apt respectively to exchange directly the heat between the operating fluid which circulates in the first cooling circuit and the hot side of the Peltier cell and between the drinking (Continued)

liquid which circulates in the second cooling circuit and the cold side of the Peltier cell to cool the drinking liquid.

7 Claims, 9 Drawing Sheets

(56) References Cited

U.S. PATENT DOCUMENTS

| | | | | |
|---|---|---|---|---|
| 3,525,648 | A * | 8/1970 | Poppendiek | G01K 17/00 136/226 |
| 4,629,589 | A * | 12/1986 | Gupta | B01F 3/04531 222/129.1 |
| 4,792,059 | A * | 12/1988 | Kerner | B67D 3/00 222/129.1 |
| 5,590,532 | A * | 1/1997 | Bachman | B67D 1/0869 62/3.3 |
| 5,675,973 | A * | 10/1997 | Dong | B01D 61/10 210/175 |
| 6,250,084 | B1 * | 6/2001 | Sato | B67D 1/00 62/3.64 |
| 6,341,491 | B1 * | 1/2002 | Paine | F25B 17/08 62/380 |
| 2004/0112571 | A1 * | 6/2004 | Kenny | F04B 17/00 165/80.3 |
| 2005/0139552 | A1 * | 6/2005 | Forsberg | E03B 3/28 62/635 |
| 2008/0022694 | A1 * | 1/2008 | Anderson | B01D 5/0072 62/3.4 |
| 2008/0184710 | A1 * | 8/2008 | Devilbiss | F25B 21/02 62/3.2 |
| 2011/0308260 | A1 * | 12/2011 | Johansson | F25D 23/126 62/66 |
| 2012/0073309 | A1 * | 3/2012 | Hung | F25B 21/02 62/3.3 |
| 2014/0047822 | A1 * | 2/2014 | Oesterle | F01N 3/043 60/320 |
| 2014/0263413 | A1 * | 9/2014 | Green | B67D 1/0888 222/1 |
| 2016/0109165 | A1 * | 4/2016 | Mackey | A47J 31/46 426/524 |
| 2016/0175783 | A1 * | 6/2016 | Jarrousse | B67D 3/0009 426/474 |
| 2017/0043992 | A1 * | 2/2017 | Green | B67D 1/0036 |
| 2018/0031285 | A1 * | 2/2018 | Thomas | F25D 17/06 |

FOREIGN PATENT DOCUMENTS

| | | |
|---|---|---|
| WO | 99/37960 A1 | 7/1999 |
| WO | 2011/030339 A2 | 3/2011 |

* cited by examiner

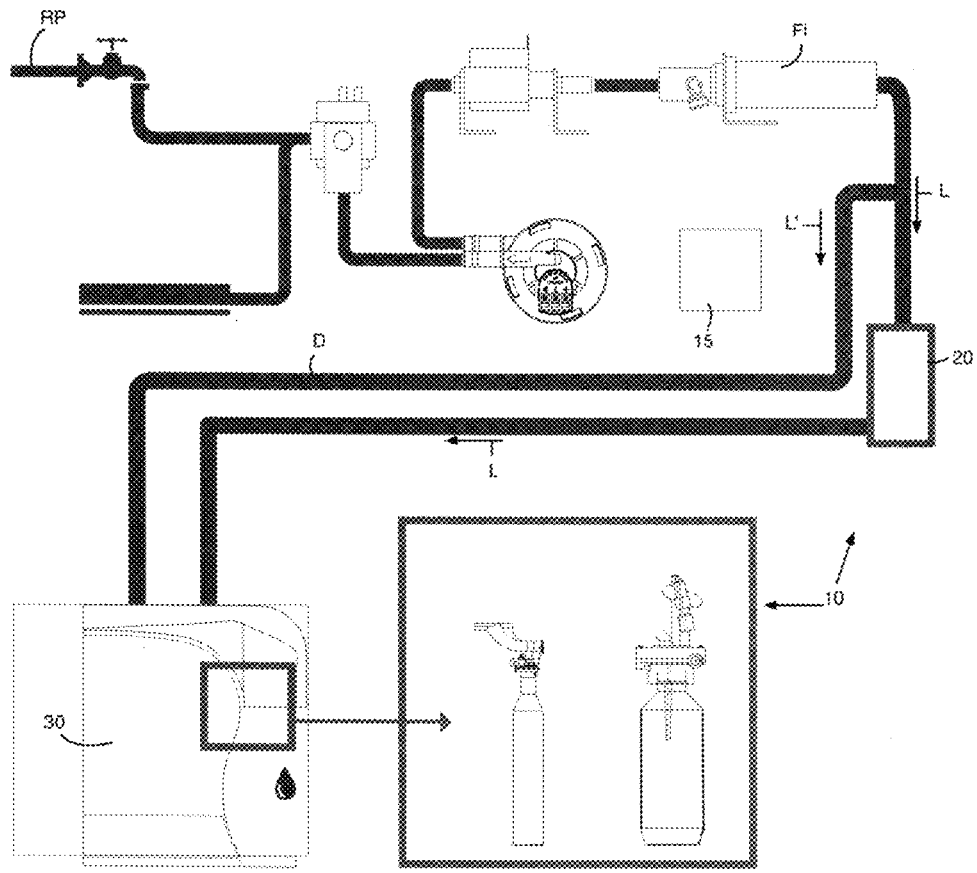

DRAWING OF THE DRINKING WATER (L) FROM THE PUBLIC WATER SUPPLY SYSTEM (RP)

↓

MEASURING OF THE TEMPERATURE OF THE OPERATING FLUID (F) AND OF THE DRINKING WATER (L) RESPECTIVELY IN THE FIRST (20') AND IN THE SECOND (20") COOLING CIRCUITS ASSOCIATED WITH THE HOT WALL (21a) AND THE COLD WALL (21b) OF THE PELTIER CELL (21)

↓

CONTROL OF THE TWO CIRCULATION PUMPS (25', 25") ASSOCIATED WITH THE FIRST (20') AND THE SECOND (20") COOLING CIRCUITS AND DEACTIVATION AND ACTIVATION OF THE PELTIER CELL (21) AS A FUNCTION OF THE TEMPERATURE OF THE OPERATING FLUID (F) AND OF THE DRINKING WATER (L) IN THE FIRST (20') AND IN THE SECOND (20") COOLING CIRCUITS

↓

OPTIONAL CARBONATATION OF THE WATER

↓

DRAWING OF THE COOLED OR NON-COOLED, GASIFIED OR NON-GASIFIED WATER ACCORDING TO THE CHOICE OF THE CONSUMER

Fig. 5

APPARATUS FOR THE COOLING OF A DRINKING LIQUID, IN PARTICULAR DRINKING WATER, WITH INNOVATIVE COOLING SYSTEM WITH PELTIER EFFECT

FIELD OF THE INVENTION

The present invention relates in general to the technical sector of the treatment of liquids and waters for drinking and intended for consumption, and more particularly it relates to an apparatus or machine for the cooling of a liquid, typically consisting of drinking water, which comprises a new and innovative system of cooling based on the so-called Peltier effect.

The present invention relates also to an innovative cooling unit, integrating a Peltier cell, which allows a significant improvement in the yield, relatively low, of the current cooling systems based on the Peltier effect.

BACKGROUND OF THE INVENTION AND PRIOR ART

The prior art presents various solutions and systems aimed in general at treating and gasifying drinking water, for example taken from the respective public water supply system.

Associating the taking of drinking water and its subsequent gasification with a cooling system having the function of appropriately cooling the water which has been taken is also known.

Now, in the current technical context as briefly illustrated above, the present invention sets the objective of bringing significant innovations and improvements, in particular as regards the system of cooling of the water which has been taken in order to be drunk and offered for consumption.

For this purpose, i.e. to create the cold conditions necessary for cooling the water, the present invention uses the physical phenomenon known as "Peltier effect" and more specifically, as described in detail here below, comprises a system of cooling, based in fact on the Peltier effect, which is characterised by an innovative unit, including and integrating a Peltier cell, also referred to by the acronym D.I.C.SY. (Direct Integrated Cooling System) which allows the overcoming and superseding of the yield limits of the current Peltier cells.

The Peltier effect, which takes its name from Jean Charles Athanase Peltier who discovered it in 1834, is a physical phenomenon, of thermoelectric nature, on the basis of which an electrical current, which passes through a zone of contact between two different metals or semiconductors, which therefore form a corresponding Peltier junction, produces a transfer of heat.

More particularly, according to the Peltier effect, referring to the circuit of FIG. 6A which schematises in fact this effect, when an electrical current I is made to pass through two different materials A and B in contact one with the other so as to form a first junction T1 and a second junction T2, it occurs that a certain quantity of heat is absorbed by the first junction T1 and a certain quantity of heat is emitted by the second junction T2, wherein the quantity of heat Q absorbed by the first junction T1 in the unit of time is defined by the following formula:

$$Q = \Pi_{AB} * I = (\Pi_B - \Pi_A) * I,$$

where $\Pi_{AB}$ is the Peltier coefficient of the thermocouple, i.e. of the couple made up of two materials A and B in contact one with the other, while $\Pi_A$ and $\Pi_B$ are the Peltier coefficients of the single materials.

The semiconductors of type P usually have a positive Peltier coefficient, while those of type N have a negative Peltier coefficient.

A typical application in the art of the Peltier effect is the so-called Peltier cell, an example of which, denoted by 21, is shown for clarity in the photographic image of FIG. 6B.

As can be seen from the photographic image of FIG. 6B the Peltier cell 21 has the appearance of a thin plate, associated with two terminals or wires 21' for the supply of an electrical current I, wherein one of the two opposite surfaces of the plate, denoted by 21a, or "hot" side of the Peltier cell, emits heat, while the other opposite surface, denoted by 21b, or "cold" side of the Peltier cell, absorbs it.

Therefore the Peltier cell, from the functional and operating aspect, is fundamentally a heat pump in the solid state, wherein the direction in which the heat is transferred depends on the direction of the electrical current I which is applied at its ends, i.e. at the two terminals 21' of the plate which constitutes the Peltier cell.

Materially, referring to the schematic image of FIG. 6C, a common Peltier cell 21 is formed by a succession of two semiconductor materials, doped, of type N and of type P respectively, connected one to the other by an upper and lower lamella in copper.

If a positive voltage is applied to the material of type N and a negative voltage to the material of type P, the upper lamella, or "cold" side of the cell, cools, while the lower one, or "hot" side of the cell, heats.

By reversing the voltage applied to the ends of the cell also the direction of transfer of heat and thermal energy correspondingly changes direction and reverses. The Peltier cells, having to transfer heat from a cold zone to a hot zone, i.e.

create a difference of temperature, absorb necessarily, on the basis of the second principle of thermodynamics, a significant amount of force and energy in the form of electrical current.

In the art the Peltier cell is commonly used to remove heat, and for this purpose its cold side is fixed so as to adhere to the body or to the zone to be cooled.

In this way the heat removed from the zone to be cooled is transferred, together with the functioning heat which is the most part, from the cold side to the hot side of the Peltier cell, from where the heat has to be evacuated and transferred to the outside environment.

Unfortunately, the Peltier cells, despite the fact they have been improved in the course of the years, continue to be affected by a series of disadvantages and limits.

In particular, among these limits, mention is made of the fact that the yield of the current Peltier cells is all in all quite low, which entails and means that, in their functioning, a high quantity of energy is lost in the form of heat, with the consequent need to have to dispose of this heat produced by the cell.

In brief the current systems of cooling which use a Peltier cell are, at least in general terms, not very efficient, consume a great deal of energy and their yield is substantially low.

In practice it occurs that, with the current applications of Peltier cells for cooling a liquid, the systems for extracting heat from the hot side of the cell and transferring heat from the liquid which has to be cooled to the cold side of the cell are often much more expensive and complex than the cell itself.

Among the documents, reflecting the prior art, which relate to systems of cooling of a liquid, in particular water, which use the Peltier effect and therefore comprise a Peltier cell, mention is made of the following: U.S. Pat. No. 5,590,532; DE 19855214A1; WO2011/030339A2; WO99/37960A1.

In particular in the systems described by these documents the water is cooled indirectly, i.e. without making the liquid flow in direct contact with the Peltier cell, but making the liquid flow in a coil or heat exchanger simply adjacent or associated to the cold side of the Peltier cell.

Moreover, in the prior art, in order to dispose of the heat produced by the Peltier cell and avoid its overheating, systems of cooling with forced air of low efficiency are usually used, or heat sinks are used, with circulation of liquid, in which the liquid flows inside the sink and not in direct contact with the Peltier cell, therefore such as to involve a low yield.

The cooling systems of the so-called heat pipe type are also found to be useless and unsuitable, in that the efficiency and the yield of these systems in transferring heat are always lower than those of the cell in producing heat for disposal.

As will be made clearer by the continuation of the description, among the objectives of the present invention there is also that of overcoming the limits and going beyond the low yield, such as those illustrated above, of the current systems of cooling that are based on the Peltier effect and therefore use Peltier cells, and to propose therefore a new apparatus or system of cooling, in particular of drinking water taken from the respective public system, wherein the Peltier effect and the corresponding Peltier cell are used in an efficient and decidedly innovative way, as also verified and confirmed by experimental data, with respect to known systems.

SUMMARY OF THE INVENTION

Therefore a first object of the present invention is to propose and make an apparatus for cooling a drinking liquid, for example drinking water taken from the respective public supply system, which innovates in an important and substantial way with respect to the apparatuses and to the systems currently known and used, based on the so-called Peltier effect, i.e. exploits in a more efficient manner this Peltier effect for directly cooling the water, so as to overcome and go beyond the limits and avoid the disadvantages of the prior art.

A second object, in any case connected to the first, of the present invention is also that of making an apparatus for the cooling of a liquid, in particular drinking water, which allows certain limits and disadvantages to be overcome which to date have prevented best and full exploitation of the potential of the so-called Peltier effect and the technology linked to this effect for cooling water.

A further object of the present invention, faced with the limits of the current systems of cooling based on the Peltier effect and in particular their low yield for cooling a fluid, for example water, by means of a Peltier cell, is also that of improving substantially this yield, and in this direction develop devices and finalise solutions, checked with adequate experimental tests, which allow this result to be achieved, optimising in general the functioning of a Peltier cell, independently of the type of fluid which is used for extracting heat from the hot side of the Peltier cell and to be cooled by means of the cold side of the same Peltier cell.

The abovementioned objects can be considered achieved in full by the apparatus for cooling a drinking liquid, in particular constituted by drinking water taken from the respective public supply system, having the features defined by the independent main claim 1, and by the cooling unit, integrating a Peltier cell, having the features defined by the independent claim 9.

Particular embodiments of the present invention are moreover defined by the dependent claims.

The invention has the merit of uniting and combining already existing technologies, appropriately improved, in a new and innovative context, so as to propose an apparatus for cooling and, optionally, also for gasification, of a drinking liquid, able to respond to market needs.

Moreover one of the innovative aspects of this cooling apparatus also consists in having combined in a single product a series of features and elements which are functional and aimed at tackling the different needs of consumers of drinks at world level, as also of taking account of the various priorities of the users of these apparatuses.

There are numerous advantages, in part already implicitly disclosed previously, which are associated with the new apparatus, in accordance with the present invention, for the cooling of a drinking liquid, including a system of refrigeration based on the Peltier effect, such as those listed here below, purely by way of an example:
  simplicity of installation;
  reduced size;
  low noise level of functioning;
  quality of the product, i.e. of the water cooled and optionally gasified, obtained with the apparatus;
  convenience of use;
  possibility of personalisation as a function of specific use needs;
  reduced energy consumption.

BRIEF DESCRIPTION OF THE DRAWINGS

These and other objects, features and advantages of the present invention will be made clearer and evident by the following description of one of its preferred embodiments, given by way of a non-limiting example, with reference to the accompanying drawings, in which:

FIG. 1 is a first general graphic diagram which illustrates as a whole the context wherein an apparatus is applied, in accordance with the present invention, for the cooling of a liquid, in particular drinking water, including a system of cooling of the water which exploits the Peltier effect;

FIG. 5 is a flow diagram which illustrates the functioning of the apparatus, in accordance with the present invention, for the cooling and the optional gasification of a drinking liquid, which exploits the Peltier effect in order to achieve this cooling.

DESCRIPTION OF A PREFERRED EMBODIMENT OF THE INVENTION

Figure 2:
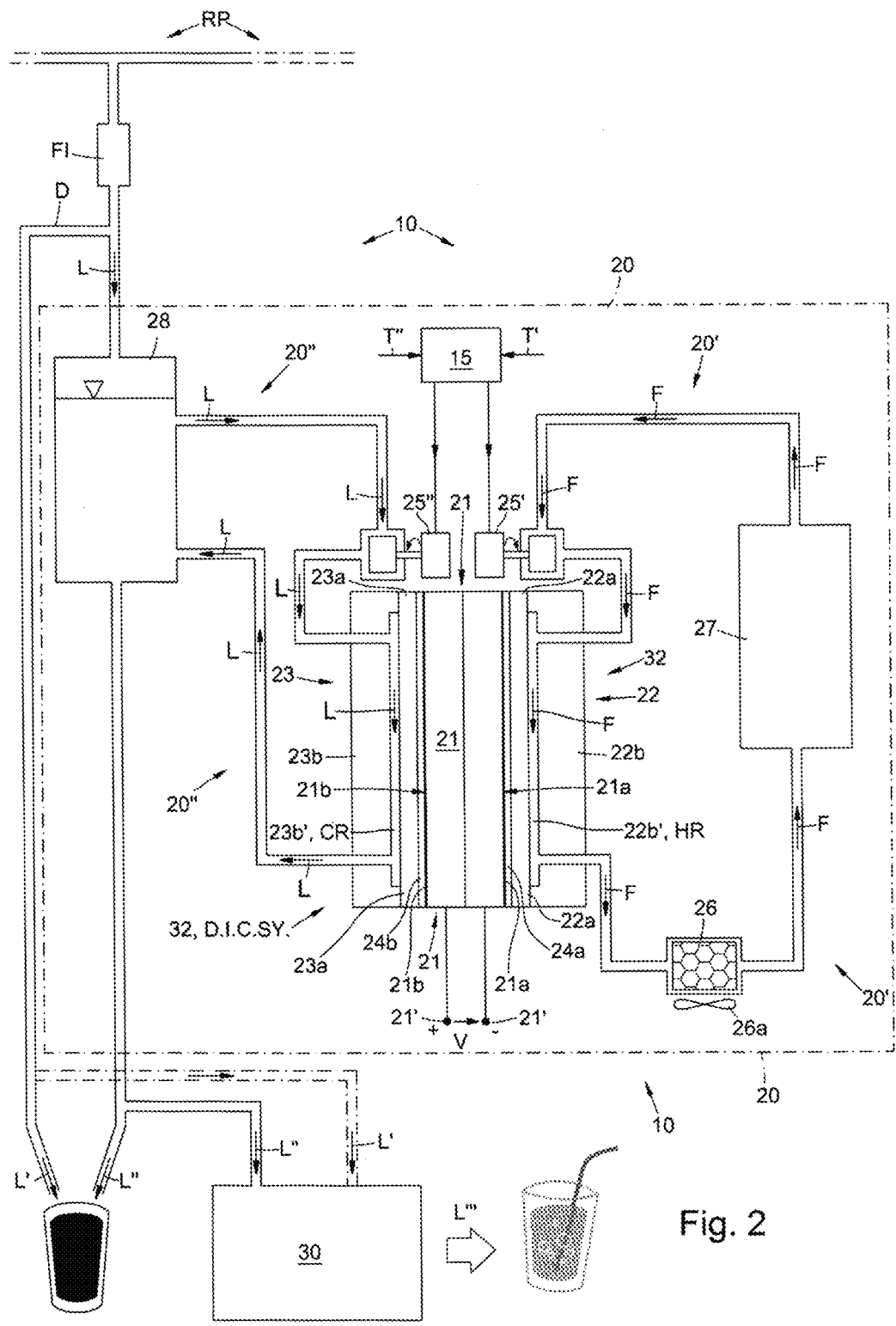
FIG. 2 is a second diagram, more detailed, of the type including functional blocks, which illustrates the cooling apparatus of the invention of FIG. 1.
Figure 2A:
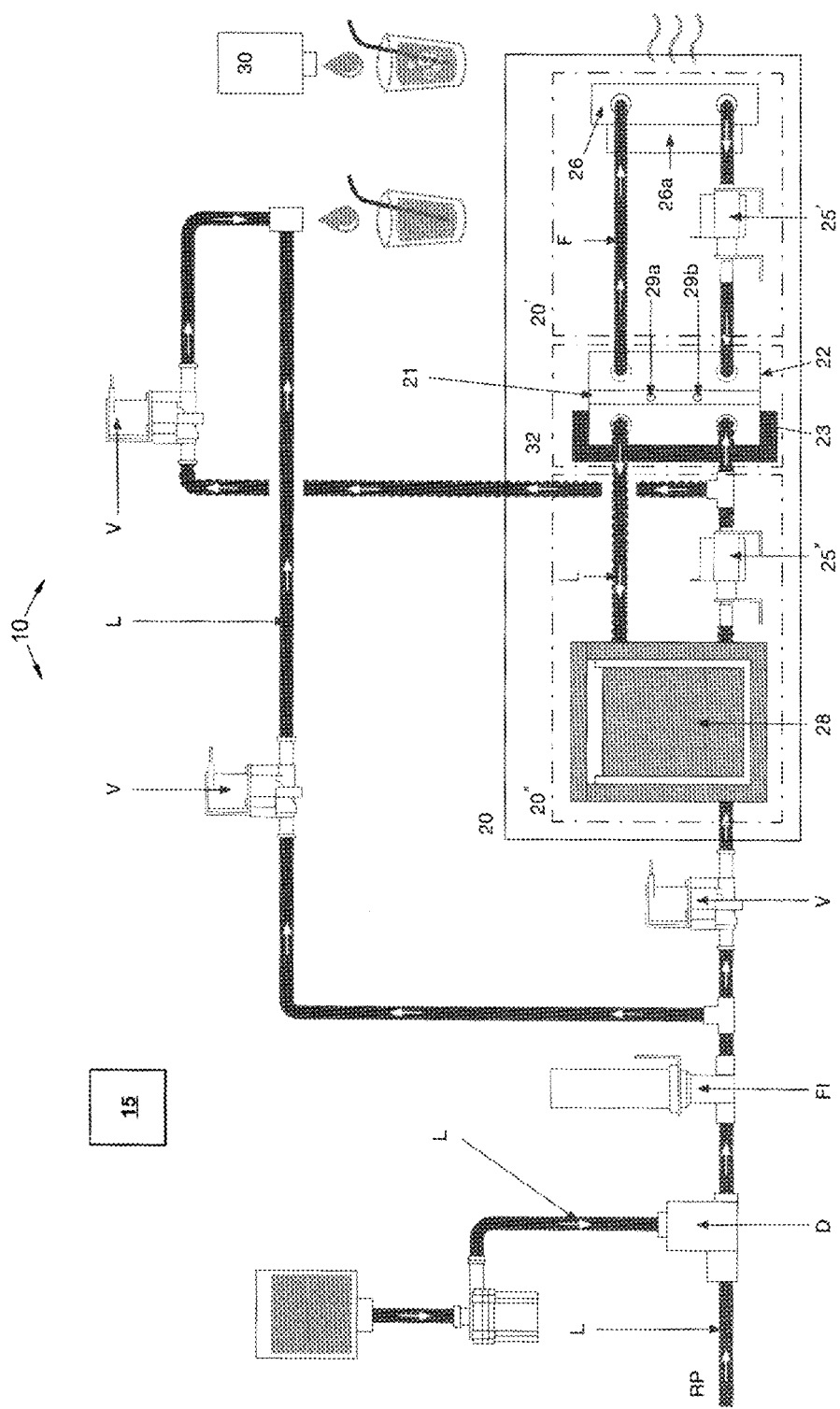
FIG. 2A is a third diagram, similar to that of FIG. 2, which illustrates with further details the cooling apparatus of the invention of FIG. 1.
Figure 4:
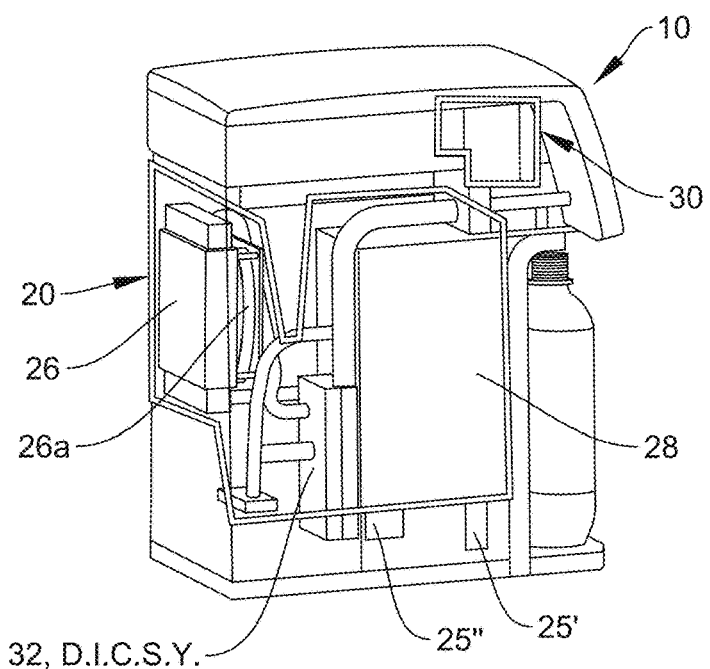
FIG. 4 is a graphic view, in three-dimensional form, of the apparatus, in accordance with the present invention, for the cooling of a drinking liquid, based on the Peltier effect.

Referring to the drawings and in particular to the functional block diagrams of FIGS. 2 and 2A, an apparatus or machine, in accordance with the present invention, aimed at refrigerating and cooling and, optionally, also at gasifying a drinking liquid, i.e. intended for consumption, is denoted overall by 10.

Typically the drinking liquid, denoted by L, is constituted by drinking water, for example taken from the respective and usual public water supply system, denoted by RP.

In detail the cooling apparatus or machine 10 of the invention comprises:
 a cooling system, denoted overall by 20, apt to receive the drinking liquid L, i.e., as previously mentioned, drinking water from the respective public water supply system RP, and to cool it; and, optionally,
 a system of gasification or carbonation, of substantially known features, denoted overall by 30 and schematised with a block in FIGS. 2 and 2A, for gasifying the drinking liquid L, after it has been cooled by the cooling system 20.

A filter FI is usually placed downstream of the water supply system RP to filter the liquid, i.e. the drinking water L, which feeds the apparatus 10 and the respective cooling system 20.

According to an essential feature of the invention, the cooling system 20 included in the apparatus 10 is based, in order to create the thermal conditions for the cooling of the drinking liquid L, i.e. of the drinking water, on the so-called Peltier effect.

To this end the cooling system 20 comprises a Peltier cell, denoted overall by 21 and provided to be supplied with an electrical voltage V at the respective ends 21', which has, on its two opposite faces, a hot side or wall 21a and a cold side or wall 21b, in which the hot side 21a is apt to heat and to generate heat, while the cold side 21b is apt to cool and therefore to remove heat, due to the effect of the voltage V applied at the ends 21', on the basis of the features and the general functioning of a usual Peltier cell.

According to a further important feature of the present invention this cooling system 20 with Peltier effect included in the apparatus 10 includes in turn, as an essential part, an innovative and special cooling unit, denoted by 32 and integrating the Peltier cell, which can be synthetically and properly defined by the acronym D.I.C.SY. (direct integrated cooling system) in which the hot side 21a and the cold side 21b of the Peltier cell 21 are associated respectively with a first and a second heat sink or exchanger, of the type with circulating fluid, denoted overall by 22 and 23 and schematised in FIGS. 2 and 2A.

The first heat exchanger 22, associated with the hot side 21a of the Peltier cell 21, is instrumental in the cooling of the same Peltier cell, i.e. in the transfer of the heat from the hot side 21a of the Peltier cell 21 to an operating cooling fluid, denoted by F, and has as sole function that of cooling and maintaining as cool as possible the hot side 21a or hot part of the cell 21.

In this way overheating of the Peltier cell 21 is avoided and also the respective cold side or cold part 21b is maintained as cold as possible.

The first heat exchanger 22 in turn is constituted by a first sheet-shaped part or sheet 22a, adjacent to the hot side 21a of the Peltier cell 21, and by a second part, adjacent and placed above the sheet 22a, constituted by a body or shell 22b, typically in plastic, which defines with the sheet 22a a chamber or gap 22b', also denoted in the drawings by HR (from hot room), with substantially laminar shape, for the flow of the operating fluid F which circulates in the exchanger 22.

Appropriately the material used for the construction of this first part or sheet 22a, adjacent to the hot side 21a, is copper, in consideration of its high capacity for conduction of heat.

Moreover, in order to optimise the transmission and the exchange of heat, a thin strip or sheet or layer 24a of thermally conductive paste or thermally conductive graphite is placed and laid between the hot side 21a of the Peltier cell 21 and the exchanger 22, i.e. the respective sheet of copper 22a.

Thanks to this configuration, in the heat exchanger 22 associated with the hot side 21a of the Peltier cell 21, the exchange of heat takes place in a direct manner, given that the operating fluid F flows in direct contact with the Peltier cell 21 by means of the sheet of copper 22a and consequently the heat is transferred directly to the operating fluid F in the chamber 22b' or HR in a very effective and uniform manner in time.

Figure 3:
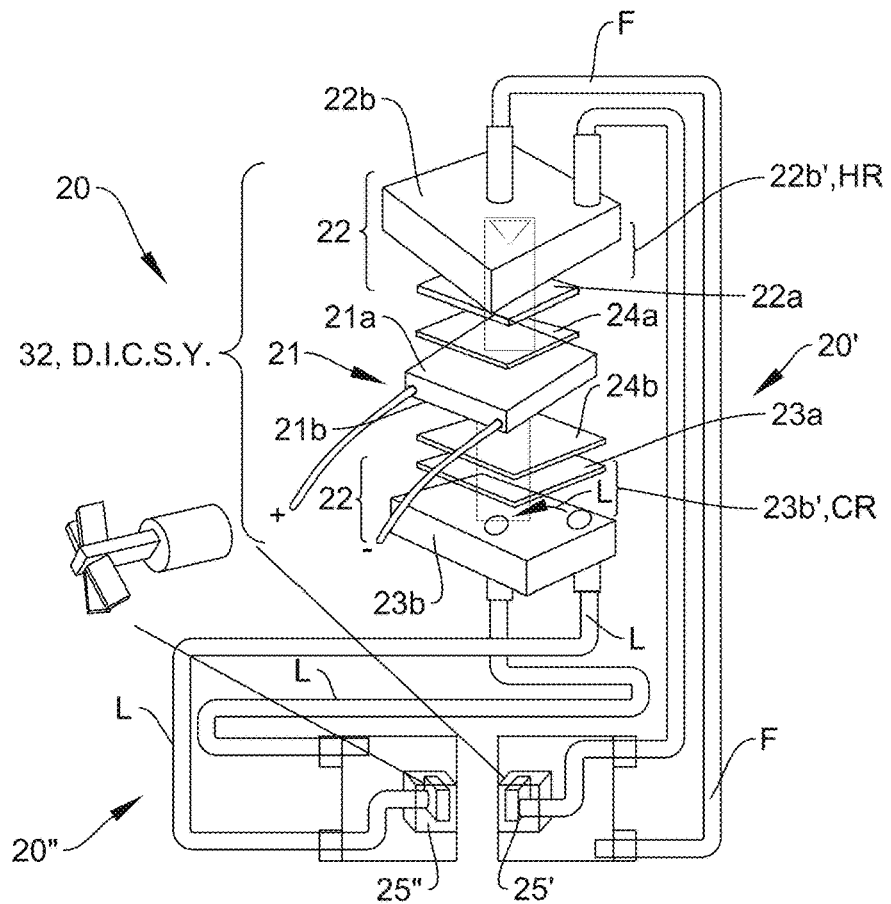
FIG. 3 is a further graphic diagram aimed at illustrating in detail the system of cooling with Peltier effect included in the apparatus of the invention.
Figure 3A:
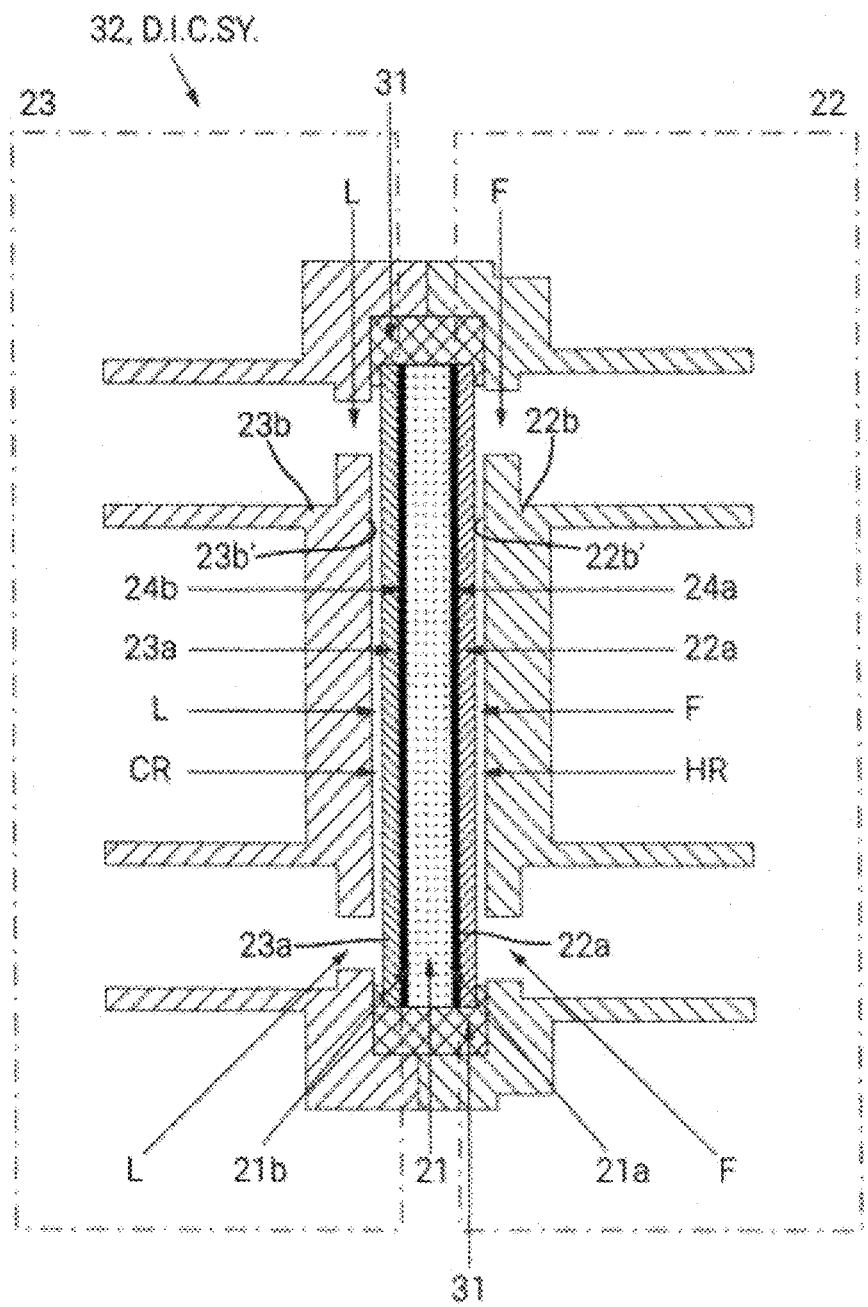
FIG. 3A is a sectioned view which shows in detail a special cooling unit (D.I.C.SY.) included in the cooling apparatus of the invention, which integrates a Peltier cell and two heat exchangers associated with the cold side and the hot side of the Peltier cell.
Figure 3B:
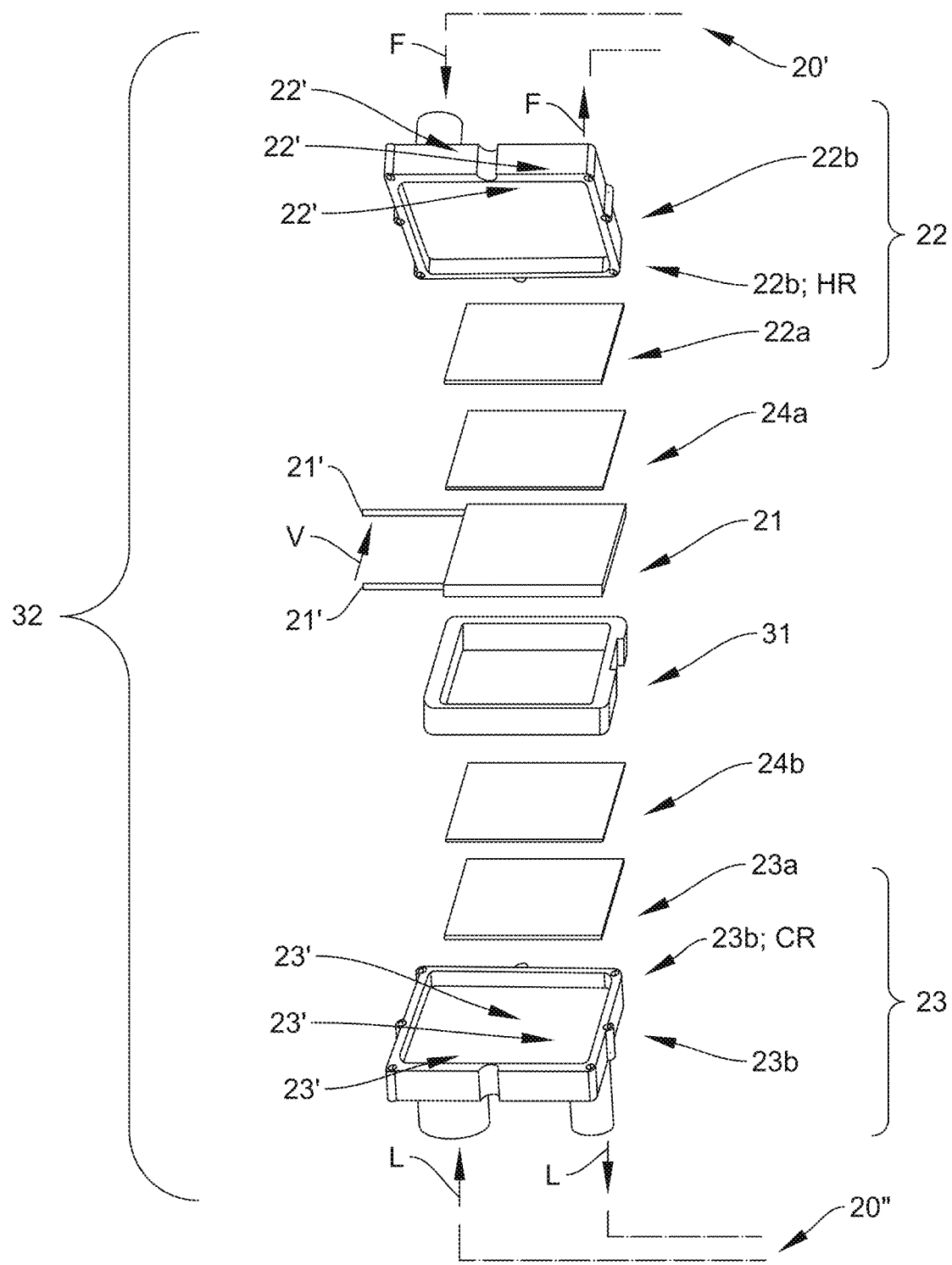
FIG. 3B is a further graphic diagram which shows in blown-up perspective form the parts of the assembly of FIG. 3 which integrates the Peltier cell in the cooling apparatus of the invention.

Moreover, again in order to optimise the exchange of heat, the inner surface of the shell 22b which defines the chamber 22b' is configured so as to define appropriate deviations, denoted by 22' in FIG. 3B, for the flow of the operating fluid F which enters and traverses the heat exchanger 22.

For the sake of clarity FIGS. 3A and 3B show in section and in blown-up perspective form the zone of this heat exchanger 22, associated with the hot side 21a of the Peltier cell 21 and the respective parts.

This first heat exchanger 22 in turn is part of and is integrated in a first cooling circuit with circulating fluid, denoted overall by 20', which is included in the wider system of cooling 20 and in which the same operating fluid or liquid F which circulates in this first heat exchanger 22 circulates in continuation.

In particular in this configuration with a continuous circulation of the operating fluid or liquid F in the cooling circuit 20', the first heat exchanger 22 has an inlet for receiving the operating fluid or liquid F and an outlet for dispensing it after, flowing through the exchanger 22, it has collected the heat produced by the hot side 21a of the Peltier cell 21 and has therefore heated, cooling consequently this hot side 21a.

Appropriately the cooling circuit 20', of which the heat exchanger 22 is part, comprises a radiator 26, in turn integrating a fan 26a, having the function of receiving and cooling the fluid F, hot, coming from the heat exchanger 22, before, through the effect of the continuous circulation in the circuit 20', it returns once again into the interior of the same exchanger 22 to collect and evacuate the heat produced by the hot side 21a of the Peltier cell 21.

The operating fluid or liquid F, which circulates in continuation in the circuit 20' and in the first exchanger 22, is typically made up of water and a solution with a base of glycol or equivalent, in an optimal percentage, so as to optimise the exchange and dissipation of the heat and eliminate any problem linked to the oxidation and deterioration of the pipes of the circuit 20', of the radiator 26 and of the same exchanger 22.

The cooling circuit 20' can be optionally provided with a tank 27, extending vertically, apt to receive the operating fluid F, coming from the heat exchanger 22, after it has been cooled by means of the radiator 26, and to dispense once again the fluid F towards the heat exchanger 22.

Preferably the cooling circuit 20' and the heat exchanger 22, i.e. the portion of the unit 32 or D.I.C.SY., integrating the Peltier cell 21, which is associated with the respective hot side 21a, are dimensioned in such a way as to maintain the temperature of the operating fluid F which enters the heat exchanger 22 at a lower temperature, for example at +12° C., with respect to the ambient one.

The second heat exchanger 23, associated with the cold side 21b of the Peltier cell 21, has instead the specific function of cooling the liquid L, i.e. the water which the consumer will then drink.

This second heat exchanger 23 is part in turn of a second cooling circuit, denoted overall by 20" and also included, like the first cooling circuit 20', in the more general and wider system of cooling 20 which receives the water L from the water supply system RP, wherein this second cooling circuit 20" has the function of connecting the second exchanger 23 with a storage tank 28, for example of 2000 ml, which receives the liquid L from the external public water supply system RP.

In detail the second heat exchanger 23 has an inlet, through which it receives from the tank 28 the water L, to be cooled, contained in the latter and supplied by the water supply system RP, and an outlet for the return into the same tank 28, via the cooling circuit 20", of the water L after it has been cooled passing through the second heat exchanger 23, in turn cooled by the cold side 21b of the Peltier cell 21.

This second heat exchanger 23 is constituted, similarly to the heat exchanger 22, by a first sheet-shaped part or sheet 23a, adjacent to the cold side 21b of the Peltier cell 21, and by a second part, adjacent and placed above the first part or sheet 23a, constituted by a body or shell 23b, typically in plastic, which acts as cover of the second exchanger 23 and defines with the sheet 23a a gap or chamber 23b', also denoted in the drawings by CR (from cool room), with substantially laminar shape, for the flow of the water L which circulates in the same exchanger 23.

The material used for the construction of this first part or sheet 23a, adjacent to the cold side 21b of the Peltier cell 21, of the second heat exchanger 23, is copper, as for the sheet 22a of the first heat exchanger 22, in consideration of its capacity for conduction of heat.

More particularly the copper of the sheet 23a is food grade copper so as to exhibit antibacterial properties and therefore avoid the proliferation of bacterial colonies and loads inside the circuit 20", as greater guarantee of the quality of the water.

As for the hot side 21a, a thin strip or layer or sheet 24b of thermally conductive paste or thermally conductive graphite is placed and laid between the cold side 21b of the Peltier cell 21 and the heat exchanger 23, i.e. the respective sheet of copper 23a, in order to optimise the transmission of heat between these two parts.

Thanks to this configuration, in the heat exchanger 23 associated with the cold side 21b of the Peltier cell 21, the exchange of heat takes place in a direct manner, given that the water L to be cooled flows in direct contact with the Peltier cell 21 by means of the sheet of copper 23a and consequently the heat is extracted directly from the water L to cool it in the chamber 23b' or CR in a very effective and uniform manner in time.

Moreover, again in order to optimise the exchange of heat, the inner surface of the shell 23b which defines the chamber 23b' is configured so as to define appropriate deviations, denoted by 23' in FIG. 3B, for the flow of the water L which enters and traverses the heat exchanger 23.

For the sake of clarity FIGS. 3A and 3B show in section and in blown-up perspective form the zone of the heat exchanger 23, associated with the cold side 21b of the Peltier cell 21, and the respective parts.

The second cooling circuit 20" and the heat exchanger 23, i.e. the portion of the unit 32 or D.I.C.SY., integrating the Peltier cell 21, associated with the respective cold side 21b, are preferably dimensioned in such a way as to reduce, constantly, at each passage in the chamber 23b' or CR, the temperature of the drinking liquid L, by some tenths of degree centigrade, until reaching the temperature set.

Appropriately both the pipes and the conduits of the cooling circuit 20" which connect the tank 28 to the second exchanger 23 and the tank 28 are insulated, in order to maintain the water which circulates in the circuit 20" as cold as possible.

The tank 28, integrated in the circuit 20", is extended in the vertical direction and can be of various capacities, for example, as already mentioned, of 2000 ml, as a function of the application required, and is also provided and appropriately configured to create a recirculation inside the same tank 28, so as to optimise the yield of the cooling circuit 20" and the relative consumption.

The drinking water L which has to be cooled by the Peltier cell 21 and therefore circulates in the circuit 20", and the cooling fluid F which has to cool the Peltier cell 21 and therefore circulates in the circuit 20' are moved independently one of the other by a respective recirculation pump or stirrer, 25" and 25', associated respectively with the second cooling circuit 20" and the first cooling circuit 20' and controlled autonomously one with respect to the other.

In this way, i.e. by providing two independent circulations of the fluid F and of the water L in the two cooling circuits 20' and 20" through the effect of the separate and distinct action of the respective two pumps 25' and 25", there is a considerable increase both in the capacity of the fluid F to take and extract heat and therefore heat, in order to cool the hot side 21a of the cell 21, and in the capacity of the drinking water L to transfer heat and therefore cool while it laps and circulates, in the gap 23b', in contact with the copper part 23a, of the second exchanger 23, in turn in contact with the cold side 21b of the cell 21.

Moreover an optimal balance is created between the heat exchange, in the zone of the cold side 21b, aimed at cooling the drinking water L, and the heat exchange, at the hot side 21a, aimed at cooling the latter and therefore at heating the operating fluid F, so that the same Peltier cell 21 is placed in the conditions of working in the best conditions and conditions of maximum yield.

A control unit, denoted by 15 and schematised with a block in FIG. 1, is apt to control and govern the general functioning of the apparatus 10 and in particular of the respective and innovative system of cooling 20, based on the Peltier effect, including as essential part the cooling unit 32 or D.I.C.SY.

Now, summarising the salient points of the previous description of the cooling apparatus 10 of the invention, it is clear that the cooling unit 32 or D.I.C.SY., integrating the Peltier cell 21, thanks to its special configuration, including two heat exchangers 22 and 23 in turn defining two respective gaps or chambers 22b' and 23b', for the flow of the operating fluid F and of the water to be cooled L, formed in direct contact with the hot side 21a and the cold side 21b of the Peltier cell 21, allows a direct exchange of the heat to be performed in the two exchangers 22 and 23 so as to optimise the efficiency and the yield of the same Peltier cell, i.e. create an optimal balance between the exchange of heat which takes place between the hot side 21a of the Peltier cell 21 and the operating fluid F and the exchange of heat which takes place between the cold wall 21b of the Peltier cell and the drinking water L.

Therefore it can be said that an important part of the present innovation consists in fact of this special configuration of the unit 32 or D.I.C.SY., integrating the Peltier cell 21, in particular characterised by the two independent gaps or chambers 22b' and 23b' which are part of the cooling circuits 20' and 20" in which the operating fluid F and the drinking water L circulate respectively and are formed in direct contact with the hot side 21a and the cold side 21b of the Peltier cell 21.

During the phase of production of the apparatus 10 and in particular of the respective unit 32 or D.I.C.SY., integrating the Peltier cell 21, a layered structure is created, with the Peltier cell 21 placed centrally, formed by thermally conductive strips or sheets 24a and 24b laid respectively on the hot side 21a and on the cold side 21b of the Peltier cell 21 and by the sheets of copper 22a and 23a, in turn placed over the strips 24a and 24b, wherein this layered structure is enclosed by a specific gasket denoted by 31, in turn closed by shells 22b and 23b, so as to define the hot room HR or 22b' and the cool room CR or 23b'.

In this way the production times are reduced considerably, guaranteeing at the same time a correct assembly of the unit formed by the Peltier cell 21 with the other parts 24a, 24b, 22a, 23a, 22b, 23b and 31.

Moreover this gasket 31 ensures the hermetic seal of the final unit 32 once the parts in plastic 22a and 22b are attached which act as cover of the two exchangers 22 and 23, so as to avoid any outflow of the fluids, i.e. of the operating fluid F and of the drinking water L, which flow in the gaps 22b' and 23b'.

This method of realisation and manufacture of this unit 32 which integrates in a single compact structure the Peltier cell 21 and the two heat exchangers 22 and 23 also represents an important aspect of the present invention.

For more complete information on this further important aspect of the present invention, concerning the manufacture of the cooling unit 32, reference is made once again to FIGS. 3A and 3B which show respectively in section and in blown-up perspective form this unit 32 or D.I.C.SY. which, as mentioned, integrates a Peltier cell with two heat sinks or exchangers so as to allow the transmission and the direct exchange of heat with the cold side and the hot side of the Peltier cell.

Figure 3C:
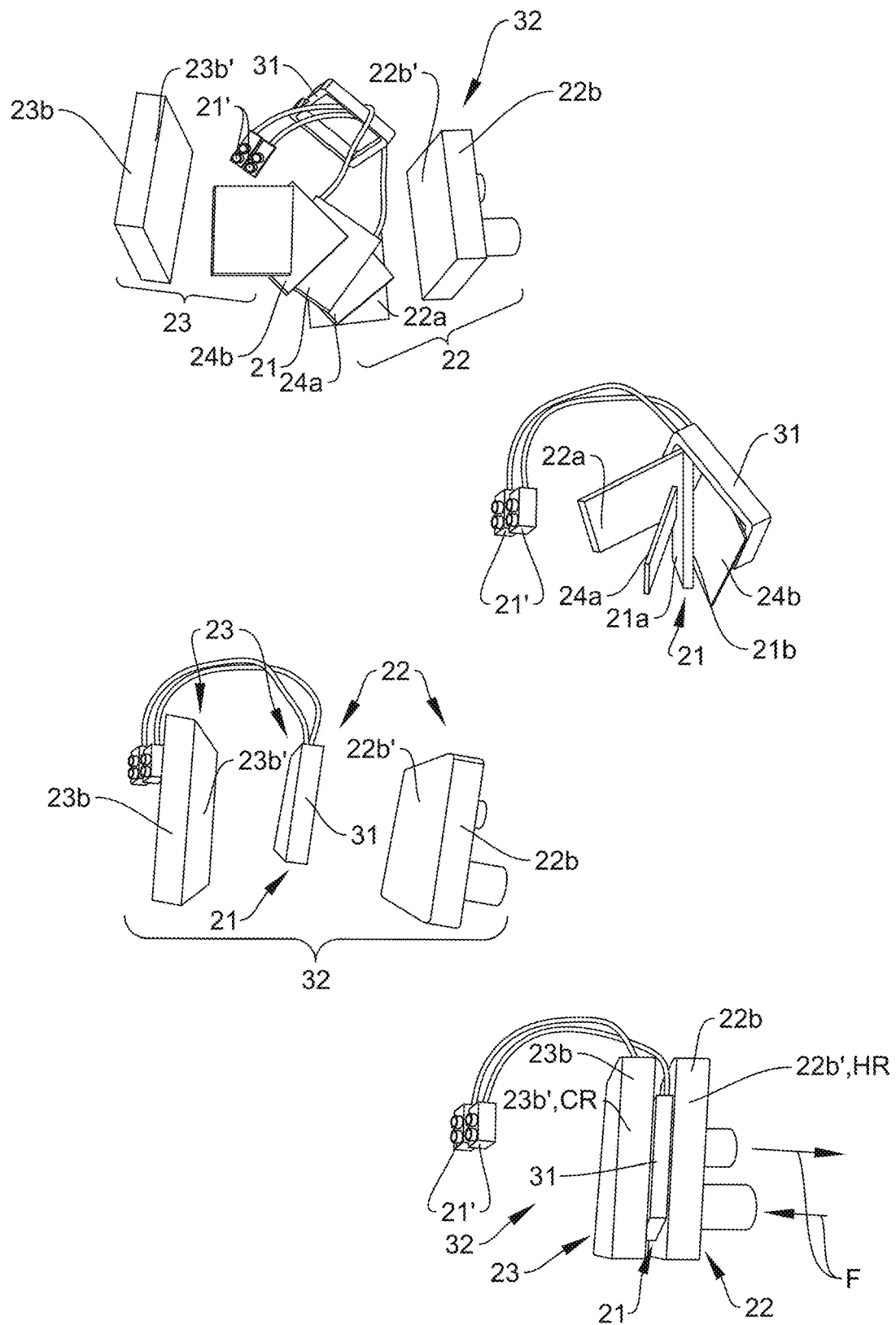
FIG. 3C is a series of photographic images of the parts, of a prototype of the cooling apparatus of the invention, in the assembled and dismantled form, which integrate in a cooling unit (D.I.C.SY.) the Peltier cell included in the apparatus of the invention and two heat exchangers associated with the cold side and the hot side of this Peltier cell.
Figure 4A:
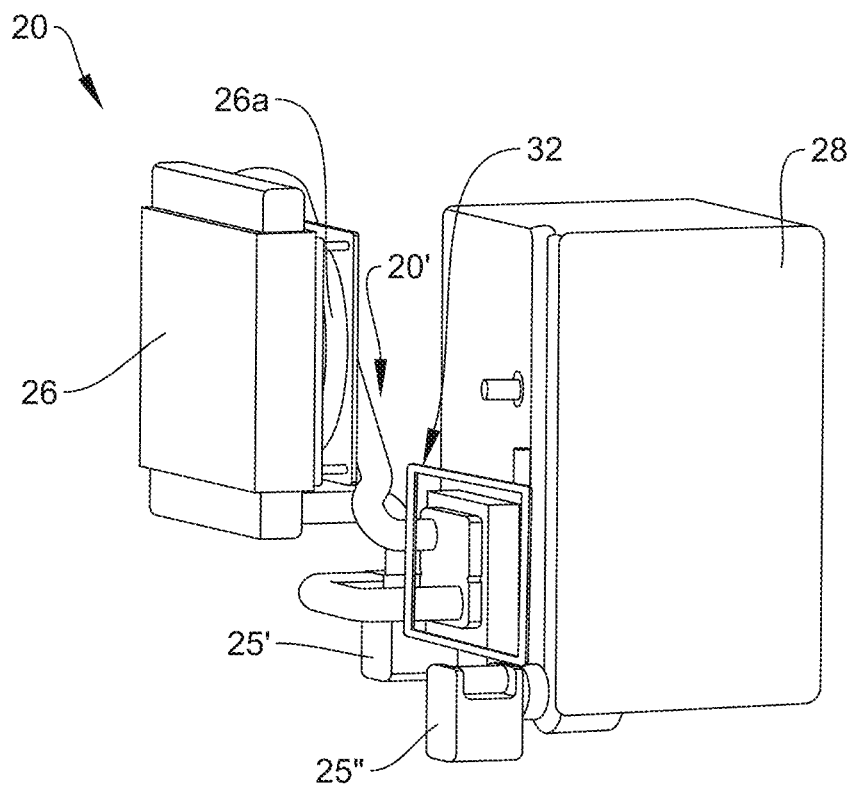
FIGS. 4A and 4B are further graphic views, in three-dimensional form, with some parts removed, of the cooling apparatus of the invention based on the Peltier effect.
Figure 4B:
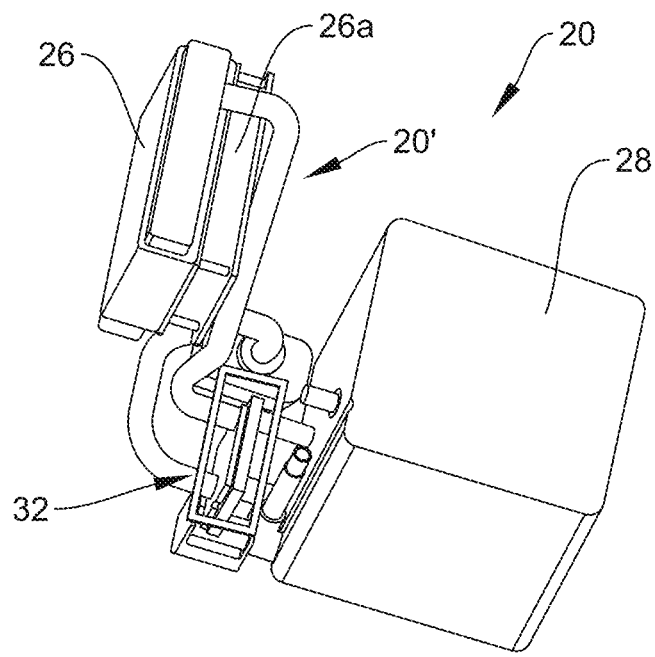
Figure 6A:
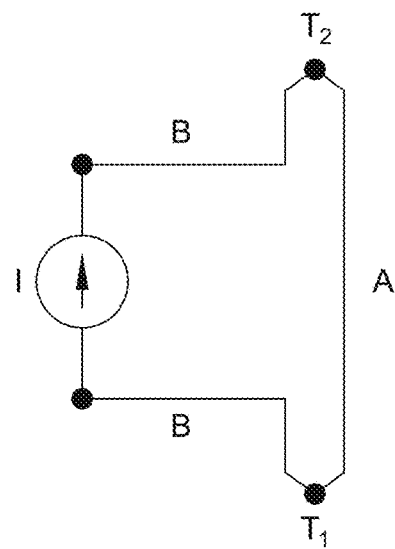
FIGS. 6A-6B-6C are diagrams and images which serve to illustrate the Peltier effect and the relative Peltier cell at the basis of the present invention.
Figure 6B:
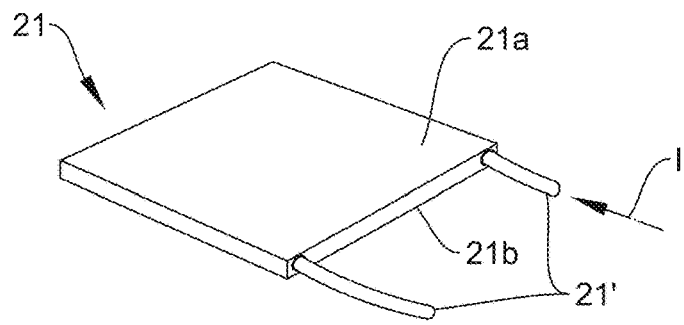
Figure 6C:
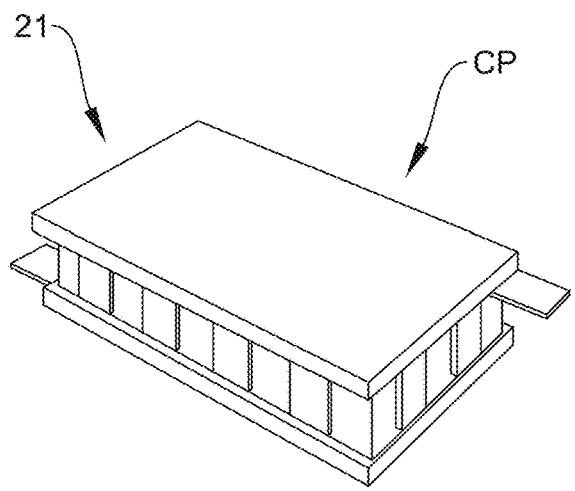

Moreover the photographic images of FIG. 3C show a prototype of this cooling unit 32, in assembled and dismantled form, included in the apparatus 10 of the invention, integrating the Peltier cell 21 and the two heat exchangers 22 and 23 associated respectively with the hot side 21a and the cold side 21b of this Peltier cell 21.

It is clearly noted, from these images, how the unit 32 or D.I.C.SY. integrating the Peltier cell 21 and the two heat exchangers 22 and 23 exhibits a typical layered structure, often referred to as "sandwich", wherein the Peltier cell 21 constitutes the central layer, and the thin sheets 24a, 24b of thermally conductive material placed on the hot side 21a and on the cold side 21b of the Peltier cell, the two sheets 22a, 23a of copper placed over the sheets 24a, 24b and the two closure bodies or plastic shells 22b, 23b placed over the sheets of copper 22a, 23a so as to define the two gaps 22b' and 23b' of laminar shape, constitute the lateral layers with respect to the central layer in this sandwich structure.

In the functioning of the apparatus 10, as also illustrated in the flow diagram of FIG. 5 and schematised in FIG. 2, both the temperature of the operating fluid F and the temperature of the drinking water L, circulating in the respective cooling circuits 20' and 20", are constantly measured and monitored by means of appropriate thermal probes, integrated in the unit 32 or D.I.C.SY and denoted by 29a and 29b in FIG. 2A, and appropriately processed by the control unit 15 in order to control, as a function of the temperatures measured, the pumps 25' and 25", so as to guarantee in time an optimal equilibrium between the heat exchange which occurs in the zone of the cold side 21b and that which occurs in the zone of the hot side 21a of the Peltier cell 21.

This optimal equilibrium, between the hot side and the cold side of the cell 21, in turn allows maximisation of the yield of the Peltier cell 21 and therefore also a considerable reduction in the running costs connected to the functioning of the entire apparatus 10.

More particularly the probe 29a has the function of automatically deactivating the supply of the Peltier cell 21, interrupting the electrical supply at its terminals, when the operating liquid F reaches and exceeds a limit temperature set, for example of 40° C., so as to allow the same operating liquid F to cool appropriately in a few minutes, passing through the radiator 26 ventilated by the respective fan 26a.

Therefore, once the cooling operating fluid F has been brought once again below the temperature set, as measured by the probe 29a, the Peltier cell 21 is once again reactivated, i.e. supplied at its terminals, safeguarding in this way the same cell from damage or overheating, and optimising its yield and therefore giving more efficiency to the system.

Similarly, in the functioning of the apparatus 10, the Peltier cell 21 is deactivated, i.e. it is no longer supplied electrically, so as to no longer transfer heat in order to cool the drinking water L, when the probe 29b detects the reaching, in the water L which circulates in this circuit 20", of the temperature set by the end user, for example 8° C.

In this way the drinking water L, while it circulates in continuation in the cooling circuit 20" in response to the action of the pump 25", is appropriately cooled by passing through the heat exchanger 23 associated with the Peltier cell 21, and accumulates in the tank 28, so as to be ready for consumption.

The user in turn may decide whether to consume the cooled water, produced in this way, in natural form or in carbonated form, in the latter case taking the water from the system of gasification 30, where the water L, cold, supplied by the tank 28, is gasified in a known manner.

It is also possible, as schematised with a dotted and dashed line in FIG. 2, to supply the gasification system 30 with the water, taken from the public system RP, simply filtered with the filtering system FI, i.e. not cooled by means of the cooling system 20 and therefore not stored in the tank 28.

Therefore summing up, as schematised again in FIG. 2, the consumer has the possibility of consuming the water L, supplied by the public system RP, in the following forms:

water simply filtered, not cooled and not gasified (arrow L');
water filtered and cooled, but not gasified (arrow L");
water filtered and gasified, but not cooled (arrow L'");
water filtered, cooled and gasified (arrow L'").

For clarity the flow diagram of FIG. 5 sums up the functioning, as a whole, of the cooling apparatus 10, under the control of the central unit 15.

Moreover, as already anticipated, the cooling apparatus 10 is appropriately associated with means such as valves V and derivations and for example the derivation D shown in FIGS. 1 and 2, which allow exclusion of the cooling system 20, as necessary and when it is not needed, and therefore to consume the water taken directly from the water supply system RP, therefore without having first cooled it with the cooling system 20.

In this case the water consumed will obviously be at ambient temperature.

Experiment Results and Tests

The cooling apparatus 10 of the invention has been the subject of in-depth tests and experiments aimed at collecting data and confirming the inventive features and the advantages thereof.

These experiments and tests, performed on a prototype of the apparatus of the invention, have allowed collection of useful information and numerous data on its effective performances, some of which illustrated here below, in particular obtained following an optimisation of the various parts of which the apparatus of the invention is made up:

the temperature of the operating liquid F does not exceed, except by a few degrees, the ambient temperature (for example with an ambient temperature of 24.0° C. a constant temperature of the operating liquid F of approximately 34° C. was measured), also without the intervention of the safety sensors and probes;
the cold side of the Peltier cell reaches a temperature close to 2° C., so as to be able to cool in approximately 2 hours 2 litres of water (from 24° C. to 10° C.): account however has to be taken of the fact that this item of data depends at least in part on the ambient temperature;
the bacterial proliferation is effectively contrasted and under control also thanks to the fact that the heat exchanger 23, in which the drinking water circulates through the effect of the action of the pump or stirrer 25", is made in food grade copper;
the well-known problem of condensation does not occur, in that the heat exchanger associated with the cold side of the Peltier cell never reaches the conditions of freezing.

It has also been found experimentally that, unlike the cooling system of the invention in which a Peltier cell is used in an optimal manner, a traditional cooling system, although based on a Peltier cell, does not allow the obtaining of a temperature of the cold water below 10°-15° C. with respect to the ambient temperature, except with enormously higher energy consumption rates.

Instead, using the cooling apparatus of the invention, characterised by the unit 32 or D.I.C.SY. which integrates the Peltier cell 21 so as to exploit it in an optimal way, it is possible with an ambient temperature equal to 30° C. to obtain constantly with low energy costs a temperature of the drinking water below 8° C.

By way of an example and for the sake of completeness of information, further given here below are some data and results obtained from experimental tests performed in the laboratory on a prototype of an apparatus or system of cooling, based on the Peltier effect and therefore including a Peltier cell, in accordance with the invention.

General Data of the Test and of the Peltier Cell Included in the Apparatus Forming the Subject of the Test Peltier cell with 100 Watts of nominal power supplied at 90 Watts with 12V Ambient temperature: 24° C.
Temperature of the water (L) to be cooled: 24° C.
Temperature of cooling liquid (F): 24° C.
Quantity of cooled water: 2.4 litres
Quantity of cooling liquid (F): 0.4 litres

| Minutes | Cold T [° C.] | Hot T [° C.] |
| --- | --- | --- |
| 0 | 24° C. | 24.0° C. |
| 5 | 23.5° C. | 26.0° C. |
| 10 | 22.9° C. | 28.0° C. |
| 30 | 20.8° C. | 32.0° C. |
| 45 | 18.9° C. | 35.0° C. |
| 60 | 16.9° C. | 35.0° C. |
| 90 | 14.5° C. | 35.0° C. |
| 120 | 12.1° C. | 35.1° C. |
| 150 | 10.5° C. | 35.0° C. |
| 180 | 8.5° C. | 35.3° C. |
| 210 | 7.8° C. | 35.2° C. |

As can be observed from the data of this test, the temperature (hot T [° C.] of the cooling liquid which receives and extracts heat from the Peltier cell tends to increase as the temperature (cold T [° C.]) at which the drinking water is cooled reduces, so that the difference between these two temperatures is higher the lower the temperature to which the drinking water is cooled.

Variants

Without prejudice to the basic concepts of the present invention it is also clear that the apparatus, described hitherto, for cooling a drinking liquid, in particular drinking water, can be the subject of changes and further improvements, without thereby departing from the scope of the same invention.

For example the cooling apparatus of the invention can be made using Peltier cells of various powers as a function of the specific application.

Therefore the gaps, i.e. the rooms HR and CR of the heat exchangers which are included in the D.I.C.SY. integrating the Peltier cell and are associated with the hot side and the cold side of the same Peltier cell, can take on various dimensions as a function of the specific application of the cooling apparatus.

Moreover the cooling apparatus can comprise several units or D.I.C.SY., integrating a Peltier cell, connected in series or parallel, as also a variable number of stirrers.

The liquid to be cooled and drunk and the operating fluid can also be different from those described hitherto.

It is again possible to use conductive materials other than copper and graphite to make the layers and the sheets included in the unit of D.I.C.SY. which integrates the Peltier cell.

The invention claimed is:

1. An apparatus for the cooling of a drinking liquid, in particular consisting of drinking water taken from a respective public supply system, comprising a cooling system which is based, in order to create thermal conditions suitable for cooling said drinking liquid, on the physical phenomenon known as "the Peltier effect",
  wherein said cooling system comprises:
    a Peltier cell;
    a first cooling circuit, in which an operating fluid circulates, associated with a hot side of the Peltier cell; and
    a second cooling circuit, in which the drinking liquid circulates, associated with a cold side of the Peltier cell;
  wherein said first cooling circuit is apt to extract heat, by means of the operating fluid circulating in said first cooling circuit, from the hot side of the Peltier cell so as to cool the Peltier cell, and
  wherein said second cooling circuit is apt to cool the drinking liquid which circulates in said second cooling circuit;
  wherein the cooling system with Peltier effect comprises a cooling unit, exhibiting a layered structure, of the sandwich type, which integrates said Peltier cell with a first and a second heat exchangers, associated respectively with the hot side and with the cold side of the Peltier cell;
  wherein said first and second heat exchangers, integrated in said cooling unit, comprise two corresponding gaps or chambers of laminar shape, defined by the layered structure of said cooling unit and extending along the corresponding hot side and cold side of the Peltier cell, so as to allow respectively said first heat exchanger and said second heat exchanger to exchange directly the heat between the operating fluid which circulates in the first cooling circuit and the hot side of the Peltier cell and between the drinking liquid which circulates in the second cooling circuit and the cold side of the Peltier cell;
  wherein the layered structure of said cooling unit integrating the Peltier cell comprises and is defined by:
    two sheets of thermally conductive material, in particular of copper, associated respectively with the hot side and the cold side of the Peltier cell; and
    two external closure bodies or shells, in particular in plastic material, placed respectively above said two sheets of thermally conductive material;
  wherein the two closure bodies and the corresponding two sheets of thermally conductive material form one with the other of the two chambers, respectively for the flow of the operating fluid and of the drinking liquid, of said first heat exchanger and said second heat exchanger, integrated in said cooling unit, apt respectively to exchange directly the heat between the operating fluid which circulates in the first cooling circuit and the hot side of the Peltier cell and between the drinking liquid which circulates in the second cooling circuit and the cold side of the Peltier cell;
  wherein said cooling unit, integrating the Peltier cell and said first and said second heat exchangers, is sealed by a gasket apt to ensure hermetic sealing against the outflow of the operating fluid and of the drinking liquid which flow in the chambers of said first and second heat exchangers;
  wherein the layered structure of the sandwich type of said cooling unit integrating the Peltier cell further comprises and is defined by:
    two further thin sheets of thermally conductive material, in particular graphite, placed in direct contact with the hot side and the cold side of the Peltier cell, adjacent to the corresponding two sheets of thermally conductive material which form with said external closure shells the two chambers for the flow of the operating fluid and of the drinking liquid through the two heat exchangers integrated in said cooling unit;
  wherein said two further thin sheets of thermally conductive material are apt to improve the heat exchange between the hot side and the cold side of the Peltier cell and the operating fluid and the drinking liquid which flow through the two heat exchangers integrated in said cooling unit; and
  wherein said two external closure bodies or shells define, in said two chambers, points of reversal of the laminar flow of the operating fluid and of the drinking liquid which traverses said first and said second heat exchangers.

2. The apparatus according to claim 1, further comprising two circulation pumps or stirrers, distinct, associated respectively with said first cooling circuit and with said second cooling circuit, whereby said two circulation pumps are apt respectively to move and circulate the operating fluid in said first cooling circuit, and the drinking water in said second cooling circuit.

3. The apparatus according to claim 2, wherein said two circulation pumps are apt to be controlled, one independently of the other, in response to the temperature of the operating fluid, as detected in the first cooling circuit, and respectively to the temperature of the drinking water, as detected in the second cooling circuit, in order to move and circulate the operating fluid in said first cooling circuit and the drinking water in said second cooling circuit.

4. The apparatus for the cooling of a drinking liquid according to claim 1, further comprising a carbonator for carbonating said drinking liquid, after the drinking liquid has been cooled by the Peltier cell of said cooling system.

5. The apparatus for the cooling of a drinking liquid according to claim 1, wherein said second cooling circuit comprises a storage tank where the drinking liquid, cooled, is stored, and wherein said storage tank is configured so as to receive in input the drinking liquid, to be cooled, and to deliver in output the drinking liquid, once cooled, to an outlet for consumption by a consumer.

6. A cooling unit with Peltier effect integrating in a layered structure, of a sandwich type and comprising:
  a Peltier cell;
  a first heat exchanger, associated with a hot side of the Peltier cell, comprising a first gap or chamber, defined by said layered structure, apt to receive a flow of a first fluid in order to transfer heat from the hot side of the Peltier cell to said first fluid and therefore heat said fluid;
  a second heat exchanger, associated with a cold side of the Peltier cell, comprising a second gap or chamber, defined by said layered structure, apt to receive a flow of a second fluid in order to transfer heat from said second fluid to the cold side of the Peltier cell and therefore cool said second fluid,
    wherein each of said first and second chambers respectively said first and said second heat exchangers, integrated in said cooling unit, has a laminar shape extending along the corresponding hot side and cold side of the Peltier cell, so as to allow a direct exchange of the heat between the first fluid which flows through the first heat exchanger and the hot side of the Peltier cell and of the heat between the second fluid which flows through the second heat exchanger and the cold side of the Peltier cell,
wherein the layered structure integrating said Peltier cell and said first and said second heat exchangers comprises and is defined by:
two sheets of thermally conductive material, in particular of copper, associated respectively with the hot side and the cold side of the Peltier cell; and
two external closure bodies or shells, in particular in plastic material, placed respectively above said two sheets of thermally conductive material,
wherein the two closure bodies and the corresponding two sheets of thermally conductive material form one with the other of said first and said second chambers respectively for the flow of the first fluid through said first heat exchanger and the flow of the second fluid through said second heat exchanger,
wherein said cooling unit, integrating the Peltier cell and said first and said second heat exchangers, is sealed by a gasket apt to ensure hermetic sealing against the outflow of the first fluid and of the second fluid which flow in said first and said second chambers of said first and second heat exchangers,
wherein the layered structure further comprises and is defined by:
two further thin sheets of thermally conductive material, in particular graphite, placed in direct contact respectively with the hot side and the cold side of the Peltier cell, adjacent to the two sheets of thermally conductive material which form with said two external closure shells the two chambers for the flow of the first and of the second fluid through the two heat exchangers integrated in said cooling unit,
wherein said two further thin sheets of thermally conductive material are apt to improve the heat exchange between the hot side and the cold side of the Peltier cell and the first and the second fluid which flow through the heat exchangers integrated in said cooling unit, and
wherein said two external closure bodies or shells define, in said first and said second chambers, points of reversal of the flow of the operating fluid and of the drinking liquid which traverses said first and said second heat exchangers.

7. The cooling unit according to claim 6, wherein said first fluid, which is subject to heat while it flows through said first heat exchanger associated with the hot side of the Peltier cell, is an operating fluid, and said second fluid, which is subject to cool while it flows through said second heat exchanger associated with the cold side of the Peltier cell, is a drinking liquid, in particular water.

* * * * *